(12) United States Patent
Finn

(10) Patent No.: US 8,242,853 B2
(45) Date of Patent: Aug. 14, 2012

(54) LOW HEADROOM OSCILLATOR

(75) Inventor: Gareth Finn, Limerick (IE)

(73) Assignee: Analog Devices, Inc., Norwood, MA (US)

( * ) Notice: Subject to any disclaimer, the term of this patent is extended or adjusted under 35 U.S.C. 154(b) by 53 days.

(21) Appl. No.: 12/698,521

(22) Filed: Feb. 2, 2010

(65) Prior Publication Data

US 2011/0187468 A1    Aug. 4, 2011

(51) Int. Cl.
*H03K 3/26* (2006.01)
(52) U.S. Cl. .................. 331/111; 331/143; 331/150
(58) Field of Classification Search ............. 331/111, 331/113, 143, 144, 150, 185
See application file for complete search history.

(56) References Cited

U.S. PATENT DOCUMENTS

| | | | | | |
|---|---|---|---|---|---|
| 4,623,852 | A | * | 11/1986 | Abou et al. | 331/111 |
| 5,107,389 | A | * | 4/1992 | Botti et al. | 361/103 |
| 5,192,877 | A | * | 3/1993 | Bittebierre et al. | 327/73 |
| 5,546,054 | A | * | 8/1996 | Maccarrone et al. | 331/111 |
| 5,614,871 | A | * | 3/1997 | Miyabe | 331/111 |
| 5,990,753 | A | * | 11/1999 | Danstrom et al. | 331/143 |
| 6,020,792 | A | * | 2/2000 | Nolan et al. | 331/111 |
| 6,064,196 | A | * | 5/2000 | Oberlin et al. | 324/179 |
| 6,157,270 | A | * | 12/2000 | Tso | 331/176 |
| 7,333,386 | B2 | * | 2/2008 | Bardouillet et al. | 365/228 |

* cited by examiner

*Primary Examiner* — Levi Gannon
(74) *Attorney, Agent, or Firm* — Kenyon & Kenyon LLP

(57) ABSTRACT

A low headroom oscillator operates at low supply voltages without the use of monostable circuits or flip flops. The oscillator operates in multiple states which allow for the charging and discharging of the capacitors alternately to enable the proper operating of the oscillator at low supply voltages without locking up.

20 Claims, 1 Drawing Sheet

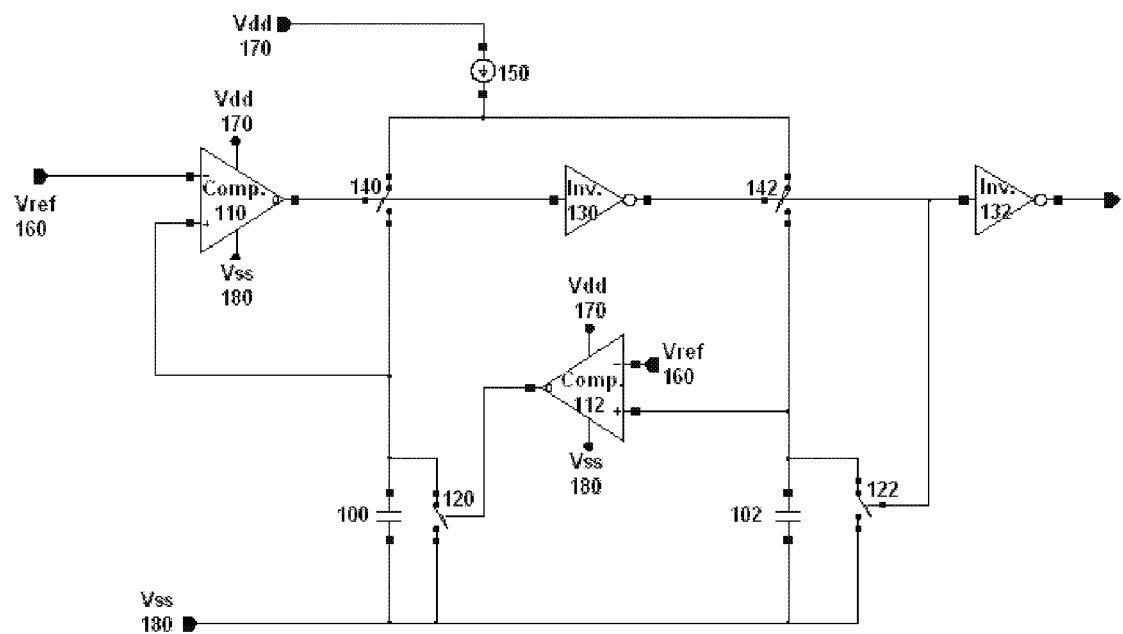

LOW HEADROOM OSCILLATOR

FIELD OF THE INVENTION

The present invention relates to a low headroom oscillator. The present invention further relates to a method of operating an oscillator at low voltage supplies while preventing the oscillator from reaching a lock up state.

BACKGROUND INFORMATION

An electronic oscillator is a device that allows for the generation of electronic signals at varying frequencies. One significant problem with oscillators is that, when coupled with a low supply voltage, the timing of the digital elements in the oscillator circuit becomes unreliable. Previous attempts to correct the timing of these elements have focused on the design of oscillator circuits which use latches, flip flops or monostable circuits, a two state circuit where one of the states remains stable but the other state is unstable for a fixed period of time before returning to a stable state (also known as "one-shot" circuits), to discharge the capacitors in the integrated circuits of the oscillators. The use of latches, flip flops or monostable circuits may operate sufficiently at standard operating supply voltage ranges, but are not reliable to control the charge and discharge of the oscillator capacitors for wide supply ranges. At low supply voltages, the oscillator may "lock up", where one of the capacitors in the integrated circuit is continually charged, and the circuit does not switch over to charge the other capacitor.

At low supply voltages, the use of monostable circuits or other latches to control the charging and discharging of the capacitors in the oscillator circuit may be problematic. Monostable circuits are used to create specific time periods where one of the states of the circuit is unstable, and at low supply voltages, a determination of the timing becomes unpredictable. The use of monostable circuits in oscillators may therefore become unreliable. In oscillator configurations that use flip flops, the flip flops may startup in an invalid state and remain in this locked state during operation of the oscillator.

Other attempts to correct the timing of the integrated circuit elements of an oscillator at low supply voltages have centered on the use of multiple reference voltages. The use of two reference voltages presents multiple problems because it requires the use of two separate and distinct references that have a large voltage range, but still operate in the common mode range of the comparators in the oscillator circuit. The selection of two reference voltages to accomplish this is neither practical nor feasible at low supply voltages.

Thus there is a need in the art, particularly for oscillators on silicon chips that have a large voltage supply range, for an oscillator that may perform at low supply voltages without locking up.

BRIEF DESCRIPTION OF THE DRAWINGS

FIG. 1 is a circuit diagram of the present invention.

DETAILED DESCRIPTION

Embodiments of the present invention provide an oscillator having a plurality of comparators, a current source, at least one inverter, and at least two capacitors. The current source in the oscillator circuit may be used to charge either capacitor in the integrated circuit. This may present the distinct advantage that only a single reference voltage may be needed for operation at low supply voltage ranges. Using the current source to alternately charge the capacitors in the integrated circuit may also allow for the design of an integrated circuit of an oscillator without the use of monostable circuits, flip flops, or other combinational logic.

FIG. 1 illustrates an integrated circuit for an oscillator which may allow for capacitors 100 and 102 to be charged and discharged alternately. In particular, the integrated circuit may be designed to have a first state where capacitor 102 is discharging when capacitor 100 is charging, and a second state, where capacitor 100 is discharging when capacitor 102 is charging.

Each capacitor 100, 102 may be connected at its capacitor plates to a three terminal device 120, 122. In a preferred embodiment, three terminal devices 120, 122, may be nMOS devices. The source and the drain terminals of nMOS device 120 may be connected to the plates of capacitor 100. The source and the drain terminals of nMOS device 122 may be connected to the plates of capacitor 102. The source terminals of nMOS devices 120, 122 and one of the plates of capacitors 100, 102 may be connected to Vss 180. Devices 120, 122 may be arranged in a manner that they turn on in alternate states. NMOS device 120 may be off when capacitor 100 is charging. Alternatively, nMOS device 122 may be turned off when capacitor 102 is charging.

The integrated circuit may also include comparators 110 and 112 that are connected to capacitors 100, 102. The positive input terminal of comparator 112 may be connected to one of the plates of capacitor 102, and may also be connected to the drain of nMOS device 122. The negative terminal of comparator 112 may be connected to a reference voltage 160, therefore comparing the voltage at the drain of nMOS device 122 to the reference voltage. The output of comparator 112 may be tied to the gate of nMOS device 120.

In a preferred embodiment, comparator 110 may be a hysteresis comparator. Selecting comparator 110 to be a hysteresis comparator may allow for tuning of the frequency and duty cycle of the oscillator.

The positive terminal of comparator 110 may be connected to one of the plates of capacitor 100 and the drain terminal of nMOS device 120. The negative terminal of comparator 110 may be connected to reference voltage 160, wherein the reference voltage 160 may be compared to the voltage at the drain of nMOS device 120. The output of comparator 110 may be connected to a three terminal device 140 and an inverter 130, which inverters the output signal to three terminal device 142.

The integrated circuit of the oscillator may contain three terminal devices 140, 142, which may preferably be pMOS devices. The gate of the pMOS device 140 may be connected to the output of hysteresis comparator 110. The connection of the gate terminal of pMOS device 140 to comparator 110 may allow for the pMOS devices to be turned on by the output of the comparator. The presence of inverter 130 between the output of comparator 110 and pMOS device 142 may allow pMOS device 142 to be turned on when device 140 is turned off. When the output of comparator 110 is high ("1"), the input to pMOS device 140 may be high ("1"), whereas the input to the gate of pMOS device 142 may be low ("0"). Conversely, when the output of comparator 110 is low ("0"), the input to pMOS device 140 may be low ("0"), whereas the input to the gate of pMOS device 142 may be high ("1"). This may allow pMOS device 142 to be off when device 140 is on, and device 142 may be on when pMOS device 140 is off.

The gate terminal of pMOS device 142 may also be connected to an inverter 132. The gate terminal of pMOS device 142 may also be coupled to the gate of nMOS device 122. The output of inverter 132 may be the voltage output of the entire oscillator.

A current source 150 may be used to bias the pMOS devices 142 and 140 to alternately charge capacitors 100 and 102. The input terminal of current source 150 is connected to Vdd 170 and the output terminal is connected to the source terminals of pMOS devices 142 and 140. In an embodiment, current source 150 may be a cascoded current source.

During operation, the oscillator may operate in two states: a first state where capacitor 100 is charging and a second state where capacitor 102 is charging. In the first state, comparator 110 may compare the voltage at the node connecting the top plate of capacitor 100 and the drain of nMOS device 120 to reference voltage 160. If capacitor 100 is not charged, the reference voltage 160 may be greater than the voltage at this node, which represents the charge on capacitor 100. If the reference voltage 160 is greater than the voltage on the top plate of capacitor 100, than comparator 110 outputs a "0". The logic "0" output from comparator may be input to the gate of pMOS device 140. PMOS device 140 may turn on because the source-gate voltage of the device is less than the threshold voltage, and current is pulled up through the drain of pMOS device 140 to charge capacitor 100.

When comparator 110 outputs a "0", inverter 130 may logically negate this input and output a "1" to the gate terminal of pMOS device 142. PMOS device 142 may turn off because the source-gate voltage of the pMOS device is greater than the threshold voltage of the pMOS device. Because pMOS device 142 may be off in the first state, capacitor 102 may not be charging.

As the gate terminal of nMOS device 122 is connected to the gate terminal of pMOS device 142, when a "1" is input to pMOS device 142 in the first state, a "1" is also input to the gate of nMOS device 122. NMOS device 122 may turn on because the gate-source voltage of the device is greater than the turn-on voltage for the nMOS device. When nMOS device 122 is on, the device may be connected to capacitor 102, and charge may be dissipated through nMOS 122. Capacitor 102 may be discharging in the first state.

Comparator 112 may compare the drain voltage of nMOS device 122 (the charge on capacitor 102) to reference voltage 160. As capacitor 102 is discharged, the charge on the capacitor may reach a level below the reference voltage 160, and therefore the input to the positive terminal of comparator 112 may be less than the reference voltage 160. If the input to comparator 112 is less than the reference voltage 160, the comparator may output a "0" to nMOS device 120.

If comparator 112 outputs a logic "0" to the gate of nMOS device 120, the nMOS device may turn off. NMOS device 120 may turn off because the gate-source voltage of the device is less than the turn-on voltage for the nMOS device and nMOS device 120 may operate in cut-off mode. Since nMOS device 120 is off, no current may flow through this device and capacitor 100 may not be discharged. This may be consistent with capacitor 100 being charged by pMOS device 140.

When the charge on capacitor 100 is greater than the reference voltage 160, the oscillator may move to the second state. In the second state, comparator 110 may compare the voltage on the top plate of the capacitor 100 to reference voltage 160. Since the voltage at capacitor 100 may be greater than the reference voltage 160, the comparator 110 may output a "1". The logic "1" output from comparator may be input to the gate of pMOS device 140. PMOS device 140 may turn off because the source-gate voltage of the device may be greater than the threshold voltage of the device. If pMOS device 140 is turned off, capacitor 100 may not be charged.

If comparator 110 outputs a "1" to inverter 130, inverter 130 may logically negate this input and output a "0" to the gate terminal of pMOS device 142. PMOS device 142 may turn on because the source-gate voltage of the pMOS device may be less than the threshold voltage of the pMOS device. When pMOS device 142 turns on in the second state, capacitor 102 may begin charging.

When inverter 130 outputs a "0" to pMOS device 142, a "0" may also be output to the connected gate of nMOS device 122. NMOS device 122 may turn off because the gate-source voltage of the device may be less than the turn-on voltage for the nMOS device. If nMOS device 122 is turned off, the nMOS device may be disconnected from capacitor 102, and charge is no longer dissipated through nMOS device 122.

In the second state, comparator 112 may compare the drain voltage of nMOS device 122 to reference voltage 160. If pMOS device 142 is on and nMOS device 122 is off, the capacitor 102 is charging and may reach a level greater than the reference voltage 160. Therefore, when nMOS device 122 is off and pMOS device 142 is on, the input to the positive terminal of comparator 112 may be greater than the reference voltage 160, and comparator 112 may output a "1" to the gate terminal of nMOS device 120.

If comparator 112 outputs a logic "1" to the gate terminal of nMOS device 120, the nMOS device may turn on. NMOS device 120 may turn on because the gate-source voltage of the device is greater than the turn-on voltage for the nMOS device. When nMOS device 120 is on, the device 120 may be connected to capacitor 100, and the capacitor may be discharged through the nMOS device.

Because comparator 110 may be a hysteresis comparator, in the second state, capacitor 100 may not be discharged to a voltage level equal to the reference voltage 160, but may be discharged to where the voltage at the top plate of capacitor 100 may be equal to $V_{REF}-V_{HYS}$. Once capacitor 100 has a charge less than $V_{REF}-V_{HYS}$, comparator 112 outputs a "0" and the oscillator returns back to the first state.

In preferred embodiments, the oscillator may operate for low supply voltages varying from 1.4 V to 3.6 V. However, the present invention is not limited to operating only with supply voltages within that range.

Several embodiments of the invention are specifically illustrated and/or described herein. However, it will be appreciated that modifications and variations of the invention are covered by the above teachings and within the purview of the appended claims without departing from the spirit and intended scope of the invention.

What is claimed is:

1. A low headroom oscillator, comprising:
   a first and a second capacitor;
   at least two nMOS devices, the two nMOS devices selectably discharging the first and second capacitors, wherein if one of the nMOS devices is turned on, the other nMOS device is turned off;
   at least two pMOS devices connected to the first and second capacitors, the two pMOS devices selectably charging the capacitors, wherein if one of the pMOS devices is turned on, the other pMOS device is turned off, the two pMOS devices being connected at gates of the two pMOS devices through a first inverter;
   a comparator and a hysteresis comparator, the comparator and the hysteresis comparator comparing a charge on the first and second capacitors to a reference voltage, wherein the hysteresis comparator tunes a frequency and a duty cycle of the oscillator, an output terminal of at least one of the comparator and the hysteresis comparator being connected to the first inverter; and
a current source that biases the two pMOS devices.

2. The low headroom oscillator according to claim 1, wherein the first and second capacitors are charged alternately.

3. The low headroom oscillator according to claim 1, wherein the first and second capacitors are discharged alternately.

4. The low headroom oscillator according to claim 1, wherein a negative input terminal of the comparator and the hysteresis comparator is connected to the reference voltage.

5. The low headroom oscillator according to claim 1, wherein each of the capacitors has a top and a bottom plate, the top plate of the first capacitor being connected to a drain of one of the nMOS devices, the bottom plate of the first capacitor being connected to a source of the same nMOS device.

6. The low headroom oscillator according to claim 5, wherein a positive input terminal of the comparator and the hysteresis comparator is coupled to the drain of one of the nMOS devices and the top plate of one of the capacitors.

7. The low headroom oscillator according to claim 5, wherein the top plate of the second capacitor is connected to a drain of the other nMOS device, the bottom plate of the second capacitor being connected to a source of the other nMOS device.

8. The low headroom oscillator according to claim 1, wherein a positive input terminal of the comparator and the hysteresis comparator is connected to a drain of one of the pMOS devices.

9. The low headroom oscillator according to claim 1, wherein the current source is connected to a source of both the two pMOS devices.

10. The low headroom oscillator according to claim 1, wherein an output terminal of one of the comparator and the hysteresis comparator is connected to a gate of one of the pMOS devices.

11. The low headroom oscillator according to claim 1, wherein the first inverter has an output, the output of the first inverter being coupled to a gate of one of the pMOS and a second inverter.

12. The low headroom oscillator according to claim 11, wherein the output from the first inverter is coupled to a gate of one of the nMOS devices.

13. The low headroom oscillator according to claim 1, wherein the low headroom oscillator is not comprised of any monostable circuits.

14. The low headroom oscillator according to claim 1, wherein the low headroom oscillator is not comprised of any flip flops.

15. The low headroom oscillator according to claim 1, wherein the current source is a cascoded current source.

16. A method for operating an oscillator at low supply voltages, the method comprising:
tuning a frequency and a duty cycle of the oscillator with a hysteresis comparator;
comparing a charge on a first capacitor to a reference voltage, wherein when the charge on the first capacitor is less than the reference voltage, the hysteresis comparator turns on a first pMOS device to charge the first capacitor;
turning off a second pMOS device if the first capacitor is charging, the second pMOS device receiving an inverted output from the hysteresis comparator, a gate of the second pMOS device being connected to a gate of the first pMOS device through a first inverter;
discharging a second capacitor through an nMOS device; and
comparing a charge on the second capacitor to the reference voltage, wherein when the charge on the second capacitor is less than the reference voltage, an additional comparator turns off an additional nMOS device, wherein an output terminal of at least one of the additional comparator and the hysteresis comparator is connected to the first inverter.

17. The method according to claim 16, further comprising:
comparing the charge on the first capacitor to the reference voltage, wherein when the charge on the first capacitor exceeds the reference voltage, the hysteresis comparator turns off the first pMOS device;
turning on the second pMOS device to charge the second capacitor;
comparing the charge on the second capacitor to the reference voltage, wherein when the charge on the second capacitor exceeds the reference voltage, the additional comparator turns on the additional nMOS device; and
discharging the first capacitor through the additional nMOS device.

18. The method according to claim 17, further comprising biasing the first and second pMOS devices with a current source.

19. The method according to claim 17, wherein the first capacitor is discharged until the charge on the first capacitor is equal to the reference voltage less a hysteresis voltage.

20. The method according to claim 16, further comprising biasing the first and second pMOS devices with a current source.

* * * * *